United States Patent
O'Brien et al.

(10) Patent No.: US 10,230,024 B2
(45) Date of Patent: Mar. 12, 2019

(54) OPTOELECTRONIC COMPONENT COMPRISING A CONVERSION ELEMENT, METHOD OF PRODUCING AN OPTOELECTRONIC COMPONENT COMPRISING A CONVERSION ELEMENT, AND USE OF AN OPTOELECTRONIC COMPONENT COMPRISING A CONVERSION ELEMENT

(71) Applicant: OSRAM Opto Semiconductors GmbH, Regensburg (DE)

(72) Inventors: David O'Brien, Bad Abbach (DE); Norwin von Malm, Nittendorf (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/744,400

(22) PCT Filed: Aug. 4, 2016

(86) PCT No.: PCT/EP2016/068670
§ 371 (c)(1),
(2) Date: Jan. 12, 2018

(87) PCT Pub. No.: WO2017/025437
PCT Pub. Date: Feb. 16, 2017

(65) Prior Publication Data
US 2018/0198034 A1     Jul. 12, 2018

(30) Foreign Application Priority Data
Aug. 7, 2015   (DE) .................. 10 2015 113 052

(51) Int. Cl.
*C09K 11/56*   (2006.01)
*C09K 11/54*   (2006.01)
(Continued)

(52) U.S. Cl.
CPC ............ *H01L 33/502* (2013.01); *C09K 11/08* (2013.01); *H01L 24/42* (2013.01); *H01L 33/501* (2013.01);
(Continued)

(58) Field of Classification Search
CPC ... H01L 33/501; H01L 33/502; H01L 33/505; H01L 24/42; H01L 2933/0041; H01L 2224/42; C09K 11/08
See application file for complete search history.

(56) References Cited

U.S. PATENT DOCUMENTS

2006/0158089 A1   7/2006  Saito et al.
2008/0237546 A1*  10/2008 LoCasio .............. C09K 11/025
                                                    252/500

(Continued)

FOREIGN PATENT DOCUMENTS

DE   10 2007 049 005 A1   3/2009
DE   10 2012 210 083 A1   12/2013
(Continued)

OTHER PUBLICATIONS

Spanhel, L., et al., "Semiconductor Clusters in the Sol-Gel Process: Quantized Aggregation, Gelation, and Crystal Growth in Concentrated ZnO Colloids", *J. Am. Chem. Soc.*, 1991, vol. 113, pp. 2826-2833.

*Primary Examiner* — Brian Turner
(74) *Attorney, Agent, or Firm* — DLA Piper LLP (US)

(57) ABSTRACT

A method of producing an optoelectronic component including a conversion element includes: A) providing a layer sequence having an active layer, wherein the active layer is configured to emit electromagnetic primary radiation; B) providing quantum dots, wherein the quantum dots are functionalized with an organic group and/or the quantum dots dissolved or dispersed in a first solvent and/or are present as a powder; C*) providing a mixture including a
(Continued)

precursor of an inorganic matrix material and of a second solvent; D) mixing the mixture obtained in step C*) with the quantum dots of step B); E) drying the mixture; and F) sintering the mixture to form the conversion element.

11 Claims, 1 Drawing Sheet

(51) Int. Cl.
| | |
|---|---|
| *C09K 11/70* | (2006.01) |
| *C09K 11/62* | (2006.01) |
| *H01L 33/50* | (2010.01) |
| *H01L 51/50* | (2006.01) |
| *C09K 11/08* | (2006.01) |
| *H01L 23/00* | (2006.01) |

(52) U.S. Cl.
CPC ........ *H01L 33/505* (2013.01); *H01L 2224/42* (2013.01); *H01L 2933/0041* (2013.01)

(56) References Cited

U.S. PATENT DOCUMENTS

| | | |
|---|---|---|
| 2009/0315446 A1 | 12/2009 | Murase et al. |
| 2013/0320298 A1 | 12/2013 | Kurtin et al. |
| 2014/0072812 A1* | 3/2014 | Hamada .............. H01S 5/02296 428/432 |
| 2014/0170789 A1 | 6/2014 | Kurtin et al. |
| 2014/0377894 A1* | 12/2014 | Kwon ................ H01L 33/0095 438/27 |
| 2015/0028365 A1 | 1/2015 | Kurtin et al. |
| 2015/0092391 A1 | 4/2015 | Eberhardt et al. |
| 2015/0123156 A1 | 5/2015 | Eberhardt et al. |
| 2016/0225966 A1* | 8/2016 | Maloney ............... H01L 33/502 |
| 2017/0044430 A1* | 2/2017 | Cichos ................ C09K 11/562 |

FOREIGN PATENT DOCUMENTS

| | | |
|---|---|---|
| DE | 10 2012 210 195 A1 | 12/2013 |
| DE | 10 2012 212 086 A1 | 1/2014 |

\* cited by examiner

OPTOELECTRONIC COMPONENT COMPRISING A CONVERSION ELEMENT, METHOD OF PRODUCING AN OPTOELECTRONIC COMPONENT COMPRISING A CONVERSION ELEMENT, AND USE OF AN OPTOELECTRONIC COMPONENT COMPRISING A CONVERSION ELEMENT

TECHNICAL FIELD

This disclosure relates to an optoelectronic component including a conversion element, a method of producing an optoelectronic component including a conversion element and use of an optoelectronic component including a conversion element.

BACKGROUND

Optoelectronic components such as light-emitting diodes (LEDs) often comprise conversion elements having a converter material. Converter materials convert the radiation emitted by a radiation source into a radiation with altered, e.g. longer wavelength. Compared to conventional converter materials, quantum dots have numerous advantages. A narrow spectral full width at half maximum (FWHM) of the emitted radiation can be achieved by quantum dots, for example. In addition, use of quantum dots allows for varying the peak wavelength of the emission radiation in a very simple manner. This makes the quantum dots very interesting, in particular for the use in solid-body illumination and backlighting displays, for example. However, quantum dots come with numerous disadvantages strongly limiting their use in optoelectronic components. Quantum dots are particularly susceptible to oxygen and humidity, plus, they are very susceptible to temperatures above 80° C., which are generated in optoelectronic components due to the heat generated by fluorescence, due to the Stoke's shift and radiation-free relaxation processes. In addition, the quantum dots must be isolated from one another to prevent energy losses due to radiation-free processes occurring due to physical contact of the quantum dots amongst each other. It is known to embed the quantum dots in organic matrix materials such as in acrylates, for example. As most of the organic matrix materials are very permeable to oxygen and moisture, the quantum dots must additionally be shielded against the environment, which is achieved by applying an inorganic layer by a CVD method or PVD method, for example. What is problematic in this case, is that the thermal expansion coefficient of such inorganic layers remarkably differs from that of the organic matrix material such that cracks occur already with slightest temperature variations due to the thermal stress. Furthermore, organic matrix materials have the disadvantage of a very low heat conductivity, which lowers the intensity of the primary radiation by which the quantum dots can be excited. In particular with very high exciting performances, the quantum dots degrade very fast due to the generated heat. Therefore, achieving the desired light yield requires the quantum dots to be distributed over a relatively large area, which increases the bulk-factor and costs of such components, however.

It could therefore be helpful to provide an optoelectronic component with a conversion element having improved properties that can additionally be produced in a cost-efficient manner.

SUMMARY

We provide a method of producing an optoelectronic component including a conversion element, including:
A) providing a layer sequence having an active layer, wherein the active layer is configured to emit electromagnetic primary radiation,
B) providing quantum dots, wherein the quantum dots are functionalized with an organic group and/or the quantum dots are dissolved or dispersed in a first solvent and/or are present as a powder,
C*) providing a mixture including a precursor of an inorganic matrix material and of a second solvent,
D) mixing the mixture obtained in step C*) with the quantum dots of step B),
E) drying the mixture, and
F) sintering the mixture to form the conversion element.

We also provide a method of producing an optoelectronic component including a conversion element, including:
A) providing a layer sequence having an active layer, wherein the active layer is configured to emit electromagnetic primary radiation,
B) providing quantum dots, wherein the quantum dots are functionalized with an organic group selected from phosphonates and sulfonates and/or the quantum dots are dissolved or dispersed in a first solvent and/or are present as a powder,
C*) providing a mixture including a precursor of an inorganic matrix material and of a second solvent,
D) mixing the mixture obtained in step C*) with the quantum dots of step B),
E) drying the mixture, and
F) sintering the mixture to form the conversion element.

LIST OF REFERENCE CHARACTERS

Figure 1:
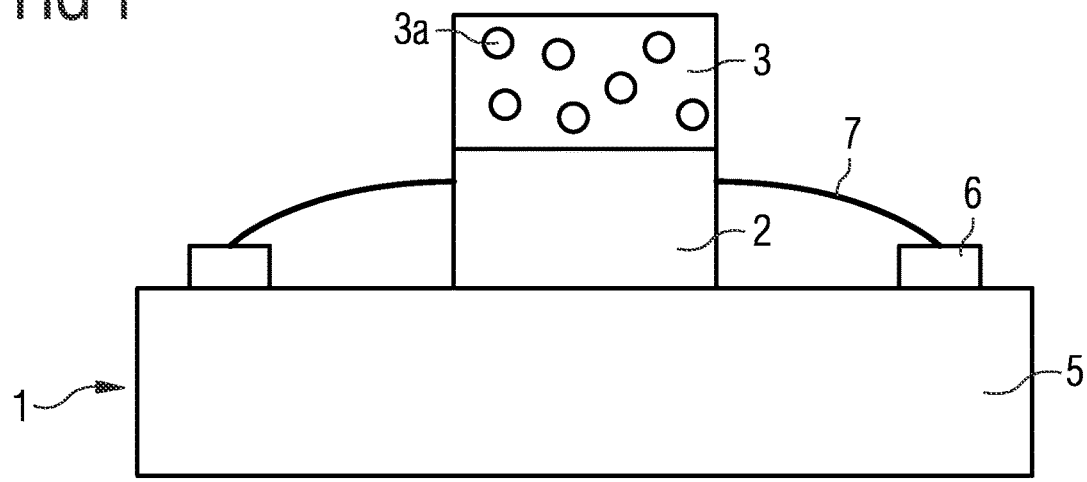
FIGS. 1 and 2 show schematic side views of various examples of optoelectronic components.

1 Optoelectronic component
2 Layer sequence
3 Conversion element
4 Casting material
3a Quantum dot
5 Carrier
6 Lead frame
7 Bonding wire
8 Housing

DETAILED DESCRIPTION

We provide an optoelectronic component. The optoelectronic component includes a layer sequence with an active layer configured to emit electromagnetic primary radiation during operation of the component. In addition, the optoelectronic component includes at least one conversion element arranged in the beam path of the electromagnetic primary radiation. The at least one conversion element includes quantum dots and an inorganic matrix material. The quantum dots are distributed in the inorganic matrix material and configured to at least partially convert the electromagnetic primary radiation into an electromagnetic secondary radiation during operation of the component.

The fact that the quantum dots at least partially convert the electromagnetic primary radiation into electromagnetic secondary radiation can mean, on the one hand, that the electromagnetic primary radiation is at least partially absorbed by the quantum dots and emitted with a wavelength range that is at least partially different from the primary radiation. Part of the absorbed primary radiation, however, is emitted in the form of heat by the quantum dots. The electromagnetic primary radiation and the electromagnetic secondary radiation may include one or multiple wavelengths and/or wavelength ranges in a red to ultraviolet wavelength range, in particular in a visible wavelength range.

The quantum dots at least partially converting the electromagnetic primary radiation into an electromagnetic secondary radiation can also mean that the electromagnetic primary radiation is almost completely absorbed by the quantum dots and emitted in the form of an electromagnetic secondary radiation and in the form of heat. The emitted radiation of the optoelectronic component may thus correspond almost completely to the electromagnetic secondary radiation. "Almost complete conversion" is to be understood as a conversion of more than 90%, in particular more than 95%.

The conversion element may include further converter materials.

It is possible for the converter element to emit a mixed radiation of primary radiation and secondary radiation of the quantum dots, of primary radiation, secondary radiation of the quantum dots and secondary radiation of the further converter materials, of secondary radiation of the quantum dots and secondary radiation of the further converter materials, which arouses a white-colored luminous impression to an observer.

"Layer sequence" in this context is to be understood as a layer sequence including more than one layer, e.g. a sequence of a p-doped and an n-doped semiconductor layer, wherein the layers are arranged on top of one another and at least one active layer that emits electromagnetic primary radiation is contained.

The layer sequence can be formed as an epitaxial layer sequence or as a radiation-emitting semiconductor chip having an epitaxial layer sequence, i.e. as an epitaxially-grown layer sequence. The layer sequence can be formed on the basis of InGaAln, for example. The InGaAlN-based semiconductor chips and semiconductor layer sequences are in particular the ones in which the epitaxially-produced semiconductor layer sequence comprises a layer sequence of different individual layers containing at least one individual layer comprising a material of the III-V semiconductor compound material system $IN_xAl_yGa_{1-x-y}N$, with $0 \leq x \leq 1$, $0 \leq y \leq 1$ and $x+y \leq 1$. Semiconductor layer sequences comprising at least one active layer based on InGaAlN can emit electromagnetic radiation in an ultraviolet to green wavelength range, for example.

As an alternative or in addition, the semiconductor layer sequence of the semiconductor chip can be based on InGaAlP, i.e. the semiconductor layer sequence can comprise different individual layers, out of which at least one individual layer comprises a material of the III-V semiconductor compound material system $In_xAl_yGa_{1-x-y}P$, with $0 \leq x \leq 1$, $0 \leq y \leq 1$ and $x+y \leq 1$.

Semiconductor layer sequences or semiconductor chips comprising at least one active layer on the basis of InGaAlP can preferably emit electromagnetic radiation with one or multiple spectral components in a green to red wavelength range, for example.

As an alternative or in addition, the semiconductor layer sequence or the semiconductor chip can also comprise other III-V semiconductor compound materials, e.g. an AlGaAs-based material, or II-VI semiconductor compound material systems. In particular, an active layer comprising an AlGaAs-based material can be suitable to emit electromagnetic radiation with one or multiple spectral components in a red to infrared wavelength range.

Besides the active layer, the active semiconductor layer sequence can include further functional layers and functional regions such as p-doped or n-doped charge carrier transport layers, i.e. electron transport layers or hole transport layers, undoped or p-doped or n-doped confinement, cladding or waveguide layers, barrier layers, planarization layers, buffer layers, protective layers and/or electrodes as well as combinations thereof. Furthermore, one or more mirror layers can be applied on a side of the semiconductor layer sequence facing away from the growth substrate. The structures described concerning the active layer or the further functional layers and regions are known with regard to design, function and structure and are therefore not explained in greater detail here.

The heat generated in the conversion element due to the quantum dots and the layer sequence can be dissipated particularly well by a conversion element including quantum dots and an inorganic matrix material. As a result, only a small or negligible heat accumulation is produced in the conversion element and a constant luminous intensity and a constant color location can be ensured over the time of operation of the optoelectronic component. An early failure of the optoelectronic component can be prevented thereby, and the service life of the optoelectronic component can be extended. In addition, it is possible for the quantum dots to be excited by a primary radiation in a high-power range. Typical, high power densities of LEDs are in a range of approximately 1.5 $W/mm^2$ for primary radiation in the blue spectral range, for example, with the value being considerably higher concerning lasers. The power density can therefore be greater than or equal to 1.5 $W/mm^2$. By a high optical power density, the required area to be irradiated decreases and therefore the number of light sources (LEDs) as well as of quantum dots required to achieve a certain light yield. Furthermore, the conversion element can be produced with comparatively thin layer thicknesses, which in addition reduces costs. Moreover, the quantum dots are protected from oxygen and moisture by the inorganic matrix material.

The inorganic matrix material may have a thermal conductivity of 1 to 50 W/mk. In these ranges, the heat developing by the quantum dots and the layer sequence can be particularly well dissipated in the conversion element. The higher the thermal conductivity of the inorganic matrix material, the better the dissipation of heat. Compared to organic matrix materials, the thermal conductivity is significantly increased. As a result, a constant luminous intensity and a constant color location can be ensured over the time of operation of the optoelectronic component. In addition, it is possible for the quantum dots to be excited by a primary radiation in a high-power range, as the developing heat is very well dissipated and does not lead to the degradation of the quantum dots.

The inorganic matrix material or the conversion element may be transparent to the primary radiation emitted by the active layer of the layer sequence.

"Transparent" means that a material, a layer or an element is transmissive for the entire electromagnetic visible spectrum, or is at least partially transmissive for a sub-spectrum thereof. The primary radiation emitted by the layer sequence can be in the visible range of the electromagnetic spectrum, for example.

The conversion element or the inorganic matrix material may be transparent to the secondary radiation emitted by the quantum dots. Preferably, the inorganic matrix material has a transparency of more than 95%. Particularly preferably, the transparency to the emitted primary radiation and/or the emitted secondary radiation of the inorganic matrix material is above 98%.

The quantum dots may be material structures in the nanometer range including $5 \times 10^1$ to $10^5$ atoms, for example.

Quantum dots are very susceptible to oxygen and humidity. Preferably, the quantum dots are particularly well protected against such environmental impact by the inorganic matrix material enclosing them such that the quantum dots exhibit a constant performance over the time of operation of the component.

The quantum dots may include a II/VI semiconductor or a III/V semiconductor. The quantum dots are selected from a group including InP, CdS, CdSe and $CuInSe_2$, for example.

The quantum dots may have an average diameter of 3 to 10 nm, particularly preferably of 3 to 5 nm. By varying the size of the quantum dots, the wavelength of the secondary radiation can be varied in a targeted manner, and therefore individually adapted to the respective application.

The quantum dots may have a spectral full width at half maximum, FWHM for short, of at most 50 nm, particularly preferably of at most 35 nm. The full width at half maximum is 30 nm, for example.

The quantum dots may include a core and a shell. In this case, the core is formed from the mentioned II/VI or III/V semiconductor compound materials, and it is surrounded by a shell. The core consists of the mentioned II/VI or III/V semiconductor compound materials, in particular. The shell can comprise or consist of an inorganic material. The core and the shell are in direct contact with each other, in particular.

The inorganic material of the shell can comprise or consist of ZnS or ZnSe.

The quantum dots may be present in an amount of 1 to 99 vol.-% with respect to the total amount of quantum dots and inorganic matrix material. If the conversion element is formed as a plate, the quantum dots are preferably present in an amount of 90 to 99 vol.-% with respect to the total amount of quantum dots and inorganic matrix material.

The inorganic matrix material may be a glass or a ceramic.

The inorganic material of the shell of the quantum dots may be a part of the ceramic or of the glass of the inorganic matrix material. This way, the quantum dots are fixedly embedded in the network of the inorganic matrix material. This allows for the generated heat to be dissipated very efficiently from the quantum dots via the matrix material.

The inorganic matrix material may be a metal oxide, a metal sulfide, a metal silicate and/or a metal phosphate. Preferably, the inorganic matrix material is a metal oxide, a metal silicate, a metal phosphate and/or a metal sulfide, particularly preferably a metal oxide, a metal silicate and/or a metal phosphate.

The metal of the metal oxide, of the metal sulfide, of the metal silicate and/or of the metal phosphate may be selected from a group including zinc, titanium, zirconium, silicon, germanium, aluminum, lithium, potassium, sodium, calcium, magnesium, copper, and combinations thereof. Preferably, the metal is selected from a group including potassium, sodium, lithium, zinc, titanium, zirconium, silicon, aluminum and combinations thereof. Particularly preferably, the metal is selected from a group including potassium, silicon, aluminum, zinc and combinations thereof.

The quantum dots may be bound to the inorganic matrix material by chemical bonds. Preferably, covalent and/or ionic bonds are concerned here. In particular, the chemical bond is present between the material of the shell of the quantum dot and the inorganic matrix material.

The inorganic matrix material may comprise or consist of ZnO, ZnS, $TiO_2$, $ZrO_2$, $SiO_2$, $AlPO_4$, $Al(H_2PO_4)_3$, $Al_2(HPO_4)_3$, $AlH_2P_3O_{10}$, $Al(PO_3)_3$, $[Al(PO_3)_3]_n$, $M_4SiO_4$, $M_2SiO_3$, $M_2Si_2O_5$ and/or $M_2Si_3O_7$, with M=Li, Na and/or K. In these inorganic matrix materials, it can be ensured that the energy band of the inorganic matrix material is greater than the energy of the secondary radiation emitted by the quantum dots. Preferably, the inorganic matrix material includes or consists of ZnO, $AlPO_4$, $Al(H_2PO_4)_3$, $Al_2(HPO_4)_3$, $AlH_2P_3O_{10}$, $Al(PO_3)_3$ and/or $K_2SiO_3$.

The quantum dots may be distributed in the inorganic matrix material either homogenously or with a concentration gradient.

The quantum dots may be arranged spaced from one another in the conversion element. As a result, non-radiating energy losses produced by the quantum dots physically contacting one another, can be prevented or largely prevented, respectively.

A protective layer may be arranged above the conversion element. The conversion element and the protective layer are in direct contact, in particular. The protective layer includes or consists of an inorganic material.

A layer or an element being arranged or applied "on to" or "above" another layer or another element can mean that a layer or an element is arranged in direct mechanical and/or electric contact on to the other layer or the other element. Furthermore, it can also mean that the one layer or the one element is arranged indirectly on or above the other layer or the other element. Here, further layers and/or elements can be arranged between the one layer or the other layer or between the one element or the other element, respectively.

Due to the fact that the protective layer and the inorganic matrix material include or consist of an inorganic material, it can be ensured that the thermal expansion coefficient is the same or approximately the same. This leads to a uniform expansion of the materials upon temperature fluctuations and temperature increase, and can thus not or hardly lead to thermal stress causing cracks.

The protective layer is applied on to the conversion element by an atomic layer deposition process, ALD for short, by PVD "physical vapor deposition" process or by a CVD "chemical vapor deposition" process. These processes allow for generation of very dense layers such that the conversion element is once more protected against the penetration of moisture or oxygen. The protective layer can include $Al_2O_3$, $SiO_2$, $TiO_2$, $Si_3N_4$ or zinc tin oxide. The protective layer includes $Al_2O_3$ or consists of $Al_2O_3$, for example. It is also possible for multiple protective layers, e.g. of $Al_2O_3$, to be arranged above the conversion element.

It is possible for the protective layer to cover the entire surface of the conversion element facing away from the layer sequence.

The optoelectronic component can include a housing. The housing can have a recess arranged in the center thereof, the layer sequence can be attached in the recess. It is also possible for the recess to be filled with a casting material covering the layer sequence. However, the recess can consist of an air space as well.

The conversion element may be formed as a plate arranged above the layer sequence. The plate can be in direct mechanical contact to the layer sequence or be arranged at a distance thereto.

The layer thickness of the entire plate can be uniform. This allows to achieve a constant color location over the entire surface of the plate. The layer thickness is 100 nm to 150 μm, for example.

The plate can be directly attached on to the layer sequence. It is possible for the plate to cover the entire surface of the semiconductor layer sequence.

The plate may be arranged above the recess of the housing. In this example of the conversion element, there is no direct and/or form-fit contact of the conversion element with the layer sequence. In other words, there can be a distance between the conversion element and the layer sequence. In other words, the conversion element is arranged downstream of the layer sequence and radiated by the primary radiation. A casting compound or an air gap can be formed between the conversion element and the layer sequence.

An adhesive layer may be arranged between the layer sequence and the plate or between the plate and the housing. In addition, an adhesive layer can be arranged between the plate and the casting compound.

The fact that a layer or an element "is arranged between two other layers or elements" can mean, that the one layer or the one element is arranged in immediate and direct mechanical and/or direct electrical contact with one of the two other layers or elements and in direct mechanical and/or electrical contact or electric or in indirect contact with other layers or other elements. In indirect contact, other layers and/or elements can be arranged between the one and at least one of the other layers or between the one and at least one of the two other elements, respectively.

It is possible for the plate to be produced separately and attached on to the layer sequence. In this case, an adhesive layer can be attached on to the layer sequence or the housing to fix the plate.

The adhesive layer may include $SiO_2$, $Si_3N_4$, $Al_2O_3$, ITO (indium tin oxide), ZnO or silicone, or consist of one of these materials.

The plate may be produced directly on the layer sequence or the housing. This proved to be advantageous in particular with plates having smaller layer thicknesses.

The conversion element may be formed as a casting compound. The conversion element can fill the recess in the housing. In this example, the conversion element covers the layer sequence.

The optoelectronic component can be luminescent diodes, photodiode-transistor-arrays/modules and/or optical couplers. As an alternative, it is possible to choose an organic light-emitting diode (OLED) as the optoelectronic component.

The specified examples of the optoelectronic component can be produced according to the method indicated below. All features mentioned in the method can as well be features of the above-specified examples of the optoelectronic component and vice versa.

A method of producing an optoelectronic component including a conversion element is disclosed. The method includes the following method steps:
A) providing a layer sequence having an active layer, wherein the active layer is configured to emit electromagnetic primary radiation,
B) providing quantum dots, wherein the quantum dots are functionalized with an organic group and/or the quantum dots are dissolved or dispersed in a first solvent and/or are present as a powder,
C*) providing a mixture including a precursor of an inorganic matrix material and of a second solvent,
D) mixing the mixture obtained in method step C) with quantum dots of method step B),
E) drying the mixture,
F) sintering the mixture to form the conversion element.

The precursor of the inorganic matrix material may be selected from a group including acetates, thioacetates, thiolates, alcoholates, phosphonates, dihydrogen phosphates, silicates, hydroxides, and combinations thereof.

Preferably, the method comprises the method steps:
A) providing a layer sequence having an active layer, wherein the active layer is configured to emit electromagnetic primary radiation,
B) providing quantum dots, wherein the quantum dots are functionalized with an organic group and/or the quantum dots are dissolved or dispersed in a first solvent and/or are present in the form of a powder,
C) providing a mixture including a precursor of an inorganic matrix material and of a second solvent, wherein the precursor of the inorganic matrix material includes acetates, thioacetates, thiolates, phosphonates and/or hydroxides, or
C') providing a mixture including a precursor of an inorganic matrix material and of a second solvent, wherein the precursor of the inorganic matrix material includes a dihydrogen phosphate and/or a metal silicate,
D) mixing the mixture obtained from method step C) or C') with the quantum dots of method step B),
E) drying the mixture,
F) sintering the mixture to form the conversion element (3).

The mixture in method step C) may include a base. The base is LiOH, $Mg(OH)_2$, NaOH or KOH. Preferably, the base is LiOH.

The mixture in method step D) may include a base or a further base. The base is LiOH, $MG(OH)_2$, NaOH or KOH, for example. Preferably, the base is $Mg(OH)_2$, NaOH or KOH. By adding the base, the inorganic matrix material precipitates. The inorganic matrix material in the colloidal form is formed.

In method step C*), a mixture may be provided that includes a precursor of an inorganic matrix material and of a second solvent, wherein the precursor of the inorganic matrix material includes a silicate, preferably $K_2SiO_3$.

In method step C'), a mixture may be produced, the mixture including a precursor of an inorganic matrix material and of a second solvent, wherein the precursor of the inorganic matrix material includes a silicate and a dihydrogen phosphate. An inorganic matrix material produced from these precursors surprisingly exhibits an improved resistance against corrosion and humidity than matrix materials that are produced only from a silicate or only from a dihydrogen phosphate.

In method step C'), a mixture including a precursor of an inorganic matrix material and of a second solvent may be provided, wherein the precursor of the inorganic matrix material includes or consists of a metal silicate and a metal dihydrogen phosphate. The metal of the metal silicate is selected from lithium, potassium, sodium, and combinations thereof, and the metal of the metal dihydrogen phosphate is selected from zinc, titanium, zirconium, aluminum, calcium, magnesium, copper, and combinations thereof. Preferably, the metal of the metal silicate is potassium, and the metal of the metal dihydrogen phosphate is aluminum.

The first and/or the second solvent may be selected from a group including water, methanol, ethanol, n-propanol, i-propanol, n-butanol, and combinations thereof. Preferably, the first and/or the second solvent is ethanol.

The organic group may be selected from a group including alcoholates, phosphonates and sulfonates. In particular, the organic group is chemically bound to the shell of the quantum dots. Through a chemical reaction, via the organic groups, the quantum dots can be bound to the inorganic matrix material. It is also possible for the organic group to split off and that it is thus no longer present in the conversion element.

The precursor of the inorganic matrix material may be a metal salt, wherein the metal salt is selected from a group including zinc, titanium, zirconium, silicon, germanium, aluminum, lithium, potassium, sodium, calcium, magnesium, copper, and combinations thereof.

The precursor of the inorganic matrix material may be selected from a group including acetates, thioacetates, thiolates, alcoholates, phosphonates, silicates, dihydrogen phosphates, hydroxides and combinations thereof. Preferably, the precursor of the inorganic matrix material is an acetate, thiolate, thioacetate or alcoholate, particularly preferably an acetate. The precursor of the inorganic matrix material is an acetate such as zinc acetate, for example.

The inorganic matrix material in colloidal form is produced in the first solvent or in the first and second solvent from the mixture provided in method step C) through a so-called sol-gel process. Formation of the inorganic matrix material in the colloidal form takes place at a temperature of 20° C. to 100° C., preferably below the boiling point of the first and/or the second solvent. Formation of the inorganic matrix material in the colloidal form can also be referred to as sol-gel formation.

The inorganic matrix material may include or consist of ZnO, ZnS, $TiO_2$, $ZrO_2$, $SiO_2$, $AlPO_4$, $Al(H_2PO_4)_3$, $Al_2(HPO_4)_3$, $AlH_2P_3O_{10}$, $M_4SiO_4$, $M_2SiO_3$, $M_2Si_2O_5$ and/or $M_2Si_3O_7$, with M=Li, Na and/or K.

The first and the second solvent may be removed in method step E). In this case, possible organic by-products such as alcohols or developing $H_2O$ are removed as well.

Method step E) may be performed at a temperature of 20° C. to 100° C.

The mixture obtained in method step D) may be applied directly on to the layer sequence. This way, the conversion element can directly form on the layer sequence. Advantageously, no adhesive layer is required between the layer sequence and the conversion element. In this way, the conversion element in the component is supported mechanically by the layer sequence and, advantageously, it is not necessary to apply a so-called "pick and place" process, i.e. a separate production of the conversion element and subsequent application on to the layer sequence. In particular with a thin conversion element, for example, only a few nanometers, this method provides considerable advantages. In addition, it is possible to adjust the conversion element directly to the dimensions of the layer sequence. A subsequent adjustment of the size such as in the case of producing the conversion element separately, is thus not necessary.

The mixture obtained in method step D) may be directly applied on to a casting compound and a housing. The layer sequence is arranged in the recess of the housing and the recess is filled with a casting material. Thus, the conversion element can form directly on the casting compound and the housing, i.e. above the recess of the housing.

Applying the mixture obtained in method step D) can be effected by dip-coating, stencil printing, screen printing, ink-jetting, spray-coating or spin-coating.

Sintering may be performed in method step F) at a temperature of below 350° C., preferably below 300° C., particularly preferably below 200° C., for example, 100° C. to 300° C., or 100° C. to 200° C. In particular, if the sintering of the mixture is effected with this mixture being applied on to the layer sequence, it can be ensured at these temperatures that the layer sequence is not damaged at these temperatures.

The inorganic material of the shell of the quantum dots may become part of the ceramic or the glass of the inorganic matrix material by the sintering. In this way, the quantum dots are firmly integrated in the network of the inorganic matrix material.

The specified examples of the phosphor can be applied to the use mentioned below. In other words, features of the phosphor and of the method are thus also disclosed for the use and vice versa.

The use of an optoelectronic component for backlighting applications is provided. For backlighting applications, a wide color space must be achieved, that has phosphors narrow-band emitting red and green, which is possible by the narrow-band emission of the quantum dots.

The layer sequence as the primary radiation source can emit a primary radiation with an emission wavelength of 350 to 450 nm, for example.

In one example of the use, this use relates to display backlighting.

Further advantages and developments result from the examples described in the following with reference to the Figures.

Like or equivalent components are indicated with the same reference characters throughout the figures, respectively. The illustrated elements and their size ratios amongst one another are not to be considered true to scale, rather, individual elements, in particular layer thicknesses, can be illustrated in an exaggerated size for the purpose of a better understanding.

The optoelectronic component 1 according to FIG. 1 shows a carrier 5 with a lead frame 6. The carrier 5 has a layer sequence 2 arranged thereon, which is electrically-connected to the lead frame 6 via bonding wires 7. The layer sequence 2 has a conversion element 2 in the form of a plate arranged over it. The conversion element 3 comprises quantum dots 3a and an inorganic matrix material, with the quantum dots 3a being distributed evenly throughout the inorganic matrix material. The inorganic matrix material consists of ZnO, for example. The quantum dots 3a consist of CdSe and a shell of ZnS. The inorganic matrix material is a ceramic, in particular, and due to the production method, the ZnS of the shell of the quantum dots 3a is part of the ceramic. The plate is arranged in the beam path of the electromagnetic primary radiation, which is emitted by an active layer (not separately illustrated here) in the layer sequence 2. Due to the high thermal conductivity of the inorganic matrix material, the developing heat can be dissipated very well in the conversion element 3. As a result, only a small or negligible heat accumulation forms in the conversion element 3, and a constant luminous intensity and a constant color location can be ensured over the time of operation of the optoelectronic component 1. It is thus possible to excite the quantum dots 3a with a higher radiation density of the primary radiation. Accordingly, less quantum dots 3a are required to achieve a desired light yield. The physical dimension of the component can thus be kept small and costs can be reduced. In addition, the inorganic matrix material protects the quantum dots 3a against moisture and oxygen. In this way, an early failure of the optoelectronic component 1 can be prevented and the service life of the optoelectronic component 1 can be extended. Plus, the conversion element 3 is robust against exposure to radiation. It does not or not significantly become cloudy and does not or not significantly start yellowing. This ensures that the light yield is not or only slightly decreased and the emission characteristics of the optoelectronic components 1 is not or only slightly altered. The mechanical strength of the conversion element 3, too, can be maintained despite these stresses at least to a large extent. The conversion element can have a protective layer (not shown here) applied on top of it by an ALD process, for example, made of $Al_2O_3$. The conversion element can thus be additionally protected against moisture and oxygen.

In addition, the layer sequence 2 and the conversion element 3 can have an adhesive layer (not shown here) attached therebetween. The adhesive layer can include silicone, for example.

The optoelectronic component 1 preferably is a LED, with the radiation being coupled-out upwards through a transparent semiconductor layer sequence 2 and the conversion element 3.

The optoelectronic component is, for example, produced as follows: an ethanolic solution of zinc acetate is added with LiOH, for example, and subsequently added with an ethanolic solution of quantum dots, that consist of a CdSe-core and a ZnS-shell. NaOH is added, forming the inorganic matrix material, i.e. ZnO, in the colloidal form. The mixture is applied on to a provided layer sequence. Ethanol and by-products are removed by raising the temperature up to 70° C., for example. Thereafter, sintering is performed at a temperature of about 200° C.

The conversion element 3 can alternatively be produced as follows: an aqueous solution of $Al(H_2PO_4)_3$ is added with quantum dots in the form of powder, which consist of a CdSe-core and a ZnS-shell. The mixture is applied on to a provided layer sequence. After drying, sintering is performed at a temperature of approximately 300° C. for three hours. The resulting matrix material includes at least $Al(H_2PO_4)_3$, $Al_2(HPO_4)_3$, $AlH_2P_3O_{10}$ and $Al(PO_4)_3$.

As an alternative, the conversion element 3 can be produced as follows: an aqueous solution of $K_2SiO_3$ and $Al(H_2PO_4)_3$ is added with quantum dots in the form of powder, which consist of a CdSe-core and a ZnS-shell. The weight ratio of $K_2SiO_3$ and $Al(H_2PO_4)_3$ is 3:1 to 8:1, for example. The mixture is applied on to a provided layer sequence. After a drying process, sintering is performed for three hours at a temperature of approximately 150° C. The formed matrix material includes a potassium silicate and an aluminum phosphate such as $Al(H_2PO_4)_3$, $Al_2(HPO_4)_3$, $AlH_2P_3O_{10}$ and $Al(PO_4)_3$.

Figure 2:
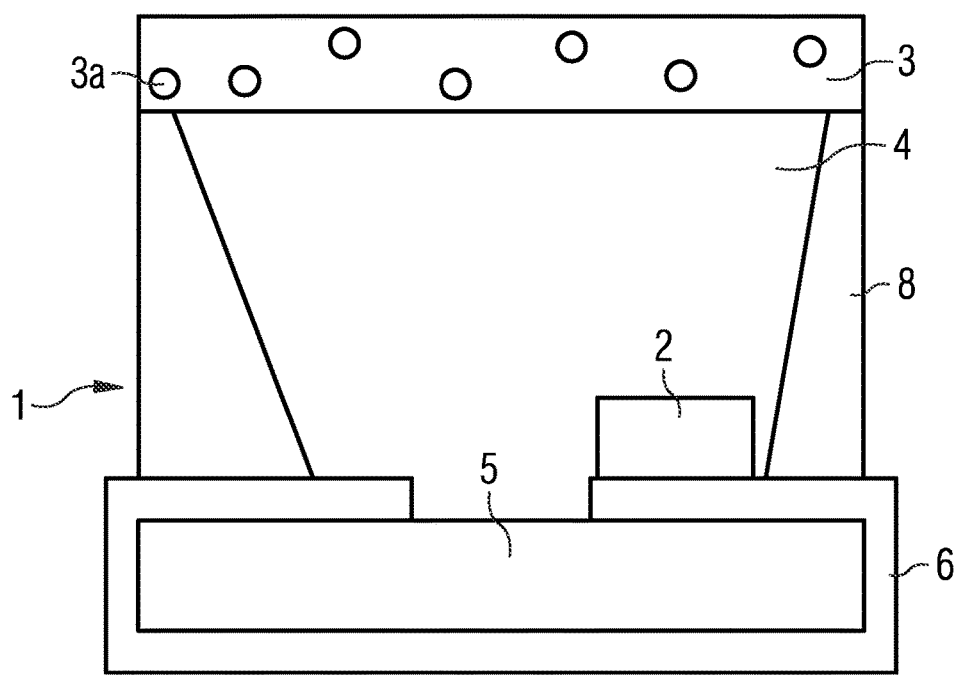

The optoelectronic component 1 according to FIG. 2 shows a carrier 5 with a lead frame 6 and a housing 8. The housing 8 comprises a recess in the center, in which the layer sequence 2 is arranged, which is connected to the lead frame 6 in an electrically-conductive manner. The recess is filled with a casting material 4. The casting material 4 includes an epoxy, for example.

A conversion element 3 is arranged above the recess of the housing 8 and the housing 8. The conversion element 3 is formed in the form of a plate and arranged in the beam path of the electromagnetic primary radiation, which is emitted by an active layer (not shown separately here) in the layer sequence 2.

The conversion element 3 includes quantum dots 3a and an inorganic matrix material, with the quantum dots 3a distributed in the matrix material in a homogenous manner, for example. The inorganic matrix material consists of ZnS, for example. The quantum dots 3a consist of $CuInSe_2$ and a shell of ZnS, for example. In particular, the inorganic matrix material is a ceramic, and due to the production method, the ZnS of the shell of the quantum dots 3a is part of the ceramic. The Zns can be produced from an ethanolic solution of zinc thioacetate and LiOH.

In addition, an adhesive layer (not shown here) can be attached between the housing and the conversion element 3 and between the casting compound 4 and the conversion element 3. The adhesive layer can include silicone, for example.

Preferably, the optoelectronic component 1 is a LED, wherein the radiation is coupled-out upwards through a transparent semiconductor layer sequence 2, a transparent casting compound 4 and the conversion element 3.

Our components and methods are not limited to the examples by this description. Rather, this disclosure comprises any new feature as well as any combination of features, which in particular includes any combination of features in the appended claims, even if the feature or combination is per se not explicitly indicated in the claims or the examples.

This application claims priority of DE 10 2015 113 052.1, the subject matter of which is incorporated herein by reference.

The invention claimed is:

1. A method of producing an optoelectronic component including a conversion element, comprising:
    A) providing a layer sequence having an active layer, wherein the active layer is configured to emit electromagnetic primary radiation,
    B) providing quantum dots, wherein the quantum dots are functionalized with an organic group and/or the quantum dots dissolved or dispersed in a first solvent and/or are present as a powder,
    C*) providing a mixture including a precursor of an inorganic matrix material and of a second solvent,
    D) mixing the mixture obtained in step C*) with the quantum dots of step B),
    E) drying the mixture, and
    F) sintering the mixture to form the conversion element.

2. The method according to claim 1, wherein the mixture includes a base in step C*) and/or D).

3. The method according to claim 1, wherein the first and/or the second solvent is selected from the group consisting of water, methanol, ethanol, n-propanol, i-propanol, n-butanol, and combinations thereof.

4. The method according to claim 1, wherein step E) is performed at a temperature of 20° C. to 100° C.

5. The method according to claim 1, wherein the organic group is selected from the group consisting of alcoholates, phosphonates and sulfonates.

6. The method according to claim 1, wherein the precursor of the inorganic matrix material includes a metal salt, and the metal is selected from the group consisting of zinc, titanium, zirconium, silicon, germanium, aluminum, lithium, potassium, sodium, calcium, magnesium, and combinations thereof.

7. The method according to claim 1, wherein the precursor of the inorganic matrix material is selected from the group consisting of acetates, thioacetates, thiolates, alcoholates, phosphonates, dihydrogen phosphates, silicates, hydroxides and combinations thereof.

8. The method according to claim 1, wherein the precursor of the inorganic matrix material is selected from the group consisting of acetates, thioacetates, thiolates, or combinations thereof.

9. The method according to claim 1, wherein the precursors of the inorganic matrix material are selected from the group consisting of dihydrogen phosphates and silicates and combinations thereof.

10. A method of producing an optoelectronic component including a conversion element, comprising:
- A) providing a layer sequence having an active layer, wherein the active layer is configured to emit electromagnetic primary radiation,
- B) providing quantum dots, wherein the quantum dots are functionalized with an organic group selected from phosphonates and sulfonates and/or the quantum dots are dissolved or dispersed in a first solvent and/or are present as a powder,
- C*) providing a mixture including a precursor of an inorganic matrix material and of a second solvent,
- D) mixing the mixture obtained in step C*) with the quantum dots of step B),
- E) drying the mixture, and
- F) sintering the mixture to form the conversion element.

11. A method of producing an optoelectronic component including a conversion element, comprising:
- A) providing a layer sequence having an active layer, wherein the active layer is configured to emit electromagnetic primary radiation,
- B) providing quantum dots, wherein the quantum dots are functionalized with an organic group and/or the quantum dots dissolved or dispersed in a first solvent and/or are present as a powder,
- C*) providing a mixture including 1) a precursor of an inorganic matrix material selected from the group consisting of acetates, thioacetates, thiolates, dihydrogen phosphates, phosphonates, hydroxides and combinations thereof and 2) a second solvent,
- D) mixing the mixture obtained in step C*) with the quantum dots of step B),
- E) drying the mixture, and
- F) sintering the mixture to form the conversion element.

* * * * *